United States Patent
Yoon

(10) Patent No.: US 8,581,363 B2
(45) Date of Patent: Nov. 12, 2013

(54) PHASE-CHANGE MEMORY DEVICE INCLUDING A VERTICALLY-STACKED CAPACITOR AND A METHOD OF THE SAME

(75) Inventor: Tae-eung Yoon, Seoul (KR)

(73) Assignee: Samsung Electronics Co., Ltd, Suwon-Si, Gyeonggi-Do (KR)

( * ) Notice: Subject to any disclaimer, the term of this patent is extended or adjusted under 35 U.S.C. 154(b) by 31 days.

(21) Appl. No.: 13/433,448

(22) Filed: Mar. 29, 2012

(65) Prior Publication Data

US 2012/0305872 A1    Dec. 6, 2012

(30) Foreign Application Priority Data

Jun. 2, 2011    (KR) .................. 10-2011-0053365

(51) Int. Cl.
*H01L 21/02*    (2006.01)
(52) U.S. Cl.
USPC .................. 257/532; 257/E45.002

(58) Field of Classification Search
USPC .............. 257/532, 534, 309, 2, E45.002
See application file for complete search history.

(56) References Cited

U.S. PATENT DOCUMENTS

2009/0321802 A1    12/2009    Choi
2012/0305872 A1*   12/2012    Yoon .......................... 257/1

FOREIGN PATENT DOCUMENTS

KR    1020060068234    6/2006
KR    1020100044033    4/2010

* cited by examiner

*Primary Examiner* — Mark Prenty
(74) *Attorney, Agent, or Firm* — F. Chau & Associates, LLC

(57) ABSTRACT

A phase change memory device includes a vertically-stacked capacitor structure having large capacitance and small area. The phase change memory device includes a phase change memory structure, and the vertically-stacked capacitor structure electrically connected to the phase change memory structure and comprising a first capacitor and a second capacitor that are stacked and electrically connected in parallel to each other.

14 Claims, 19 Drawing Sheets

PHASE-CHANGE MEMORY DEVICE INCLUDING A VERTICALLY-STACKED CAPACITOR AND A METHOD OF THE SAME

CROSS-REFERENCE TO RELATED APPLICATIONS

This application claims the benefit of Korean Patent Application No. 10-2011-0053365, filed on Jun. 2, 2011, in the Korean Intellectual Property Office, the disclosure of which is incorporated by reference herein in its entirety.

TECHNICAL FILED

The present inventive concept relates to a phase-change memory device and a method of manufacturing thereof, and more particularly, to a phase-change memory device including a vertically-stacked capacitor structure and method of manufacturing the vertically-stacked capacitor structure in the phase-change memory

DESCRIPTION OF THE RELATED ART

Phase-change memory devices store data by changing a material phase state of a phase-change material by applying a current to the phase-change material. In a power circuit unit for stably supplying a large amount of current to the phase-change material, a capacitor structure having a high capacitance per unit area is required to reduce chip size of the phase-change memory devices.

SUMMARY

In an embodiment of the inventive concept, a vertically-stacked capacitor structure comprises a first and second capacitors. The first capacitor includes a first upper conductive layer, a first lower conductive layer and a first dielectric layer disposed between the first lower conductive layer and a lower surface of the first upper conductive layer. The second capacitor includes a plurality of unit capacitors formed on an upper surface of the first upper conductive layer and defined by two neighboring insulation capacitor layers formed on the upper surface. Each of the plurality of unit capacitors includes a second lower conductive layer formed on both the upper surface and inner sidewalls of the two neighboring insulation capacitor layers, a second upper conductive layer and a second dielectric layer disposed between the second lower conductive layer and the second upper conductive layer. The vertically-stacked capacitor structure further comprises a contact plug connecting the second upper conductive layer and the first lower conductive layer. The second dielectric layer is further disposed on top of the two neighboring insulation capacitor layers.

The second lower conductive layer is configured to have two parallel plates, each of two parallel plates being formed on the inner sidewalls of the two neighboring insulation capacitor layers respectively. Alternatively, the second lower conductive layer is configured to have a circular-shaped plate. Alternatively, the second lower conductive layer is configured to have an U-shaped plate.

The first upper conductive layer is a single conductive layer. Specifically, the single conductive layer is a polysilicon layer doped with one of first and second conductivity type impurities. Alternatively, the first upper conductive layer includes at least two conductive layers stacked on each other, one of the conductive layers being a metal layer. The first upper conductive layer further includes an insulation layer on top of the conductive layers, the insulation layer including one or more contact plugs to connect the second upper conductive layer and the metal layer.

The first lower conductive layer includes recessed non-planar regions, an upper portion of the first lower conductive layer being doped with one of first and second conductivity type impurities.

In another exemplary embodiment of the inventive concept, a method of manufacturing a vertically-stacked capacitor structure comprising a step of forming a first capacitor including a first upper conductive layer, a first lower conductive layer and a first dielectric layer disposed between the first lower conductive layer and a lower surface of the first upper conductive layer; and a step of forming a second capacitor including a plurality of unit capacitors formed on an upper surface of the first upper conductive layer and defined by two neighboring insulation capacitor layers formed on the upper surface, each of the plurality of unit capacitors including a second lower conductive layer formed on both the upper surface and inner sidewalls of the two neighboring insulation capacitor layers, a second upper conductive layer and a second dielectric layer disposed between the second lower conductive layer and the second upper conductive layer, and a step of forming a contact plug connecting the second upper conductive layer and the first lower conductive layer.

In still another embodiment of the inventive concept, a phase change memory device comprises a phase change memory structure including a storage structure and a diode, and a vertically-stacked capacitor structure electrically connected in parallel to each other. The vertically-stacked capacitor structure comprises a first and second capacitors. The first capacitor includes a first upper conductive layer, a first lower conductive layer and a first dielectric layer disposed between the first lower conductive layer and a lower surface of the first upper conductive layer. The second capacitor includes a plurality of unit capacitors formed on an upper surface of the first upper conductive layer and defined by two neighboring insulation capacitor layers formed on the upper surface. Each of the plurality of unit capacitors includes a second lower conductive layer formed on both the upper surface and inner sidewalls of the two neighboring insulation capacitor layers, a second upper conductive layer and a second dielectric layer disposed between the second lower conductive layer and the second upper conductive layer. The vertically-stacked capacitor structure further comprises a contact plug connecting the second upper conductive layer and the first lower conductive layer. The second dielectric layer is further disposed on top of the two neighboring insulation capacitor layers.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
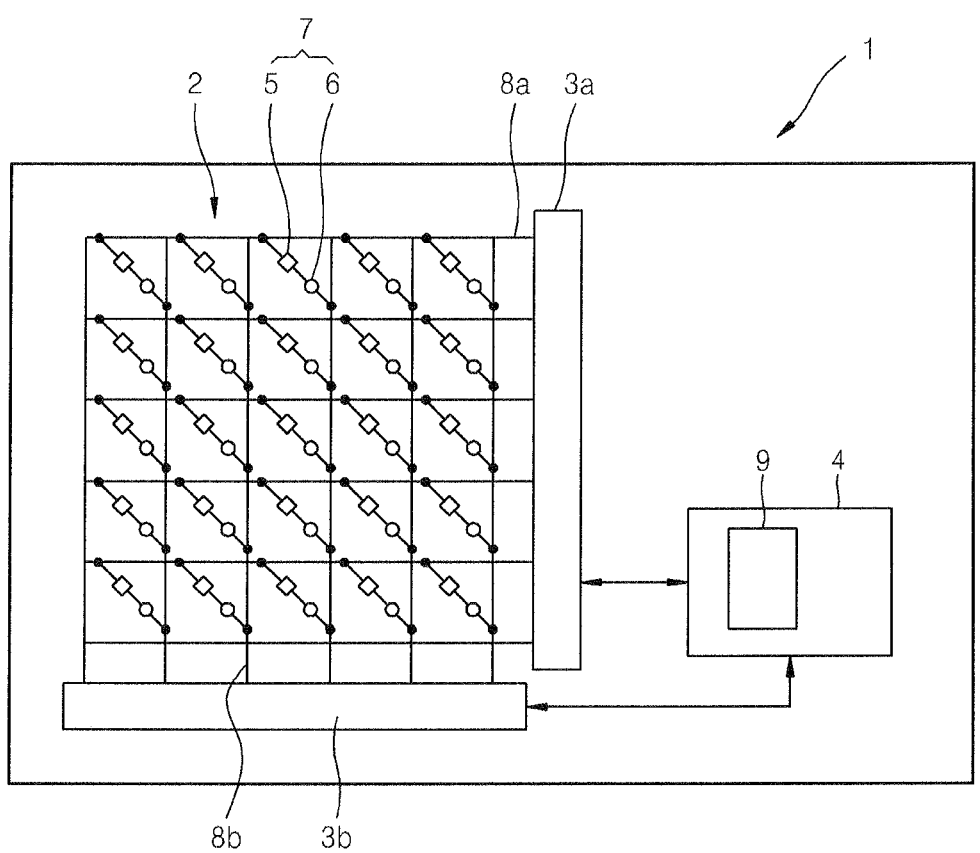
FIG. 1 is a schematic circuit diagram of a phase change memory device according to some embodiments of the inventive concept.

Reference will now be made in detail to exemplary embodiments, examples of which are illustrated in the accompanying drawings. However, exemplary embodiments are not limited to the embodiments illustrated hereinafter, and the embodiments herein are rather introduced to provide easy and complete understanding of the scope and spirit of exemplary embodiments. In the drawings, the thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic circuit diagram of a phase change memory device 1 according to some embodiments of the inventive concept.

Referring to FIG. 1, the phase change memory device 1 may include a phase change memory array 2, a row decoder 3a, a column decoder 3b, and a control circuit 4.

The phase change memory array 2 is arranged in a form of matrix and includes a plurality of memory device unit cells 7 each including a memory portion 5 and an access portion 6.

The memory portion 5 may include phase-change materials, ferroelectric materials, or magnetic materials. A state of the memory portion 5 may be determined according to the amount of a current supplied via bitlines (not shown). In the following embodiments of the inventive concept, a phase-change random access memory (PRAM) including phase-change materials as a memory device of the memory portion 5 will be described. However, the technical idea of the inventive concept is not limited thereto, and the memory device may include a ferroelectric RAM (FRAM) and a magnetic RAM (MRAM), etc.

When the memory portion 5 includes a phase-change material layer, the phase-change material layer is heated at a temperature between a crystallization temperature and a melting point for a predetermined amount of time and then is slowly cooled, the phase-change material layer is in a crystalline state. The crystalline state is referred to as a set state and may be a state in which data '0' is stored. On the other hand, when the phase-change material layer is heated at a temperature over the melting point and then is quickly cooled, the phase-change material layer is in an amorphous state. The amorphous state is referred to as a reset state and may be a state in which data '1' is stored. Thus, a current may be supplied to the phase-change material layer, and data may be stored according to a state of the phase-change material layer, and the data may be read by measuring a resistance value of the phase-change material layer. A heating temperature of the phase-change material layer is in proportional to an amount of current. The more the amount of the current increases, the more difficult a high integration is attained. A change of the amorphous state (the reset state) requires a greater amount of current than a change of the crystalline state (the set state), which increases power consumption of the memory device. Thus, to stably supply a great amount of current to the memory device, a high capacity capacitor is required. The capacitor may be provided by the control circuit 4 in the technical idea of the inventive concept.

The access portion 6 controls current supply to the memory portion 5 according to a voltage of a wordline. The access portion 6 may be a diode, a bipolar transistor, or a MOS transistor.

In addition, the plurality of memory device unit cells 7 are electrically connected to a first address line 8a and a second address line 8b. The first address line 8a and the second address line 8b are arranged at a predetermined angle in a two-dimensional (2D) manner. The predetermined angle may be a right angle. However, the inventive concept is not limited thereto. One of the first address line 8a and the second address line 8b may be a bitline, and the other one thereof may be a wordline.

The row decoder 3a may communicate with the phase change memory array 2 via the first address line 8a. The column decoder 3b may communicate with the phase change memory array 2 via the second address line 8b.

The control circuit 4 may transmit a row address signal to the row decoder 3a, and the row decoder 3a may decode the row address signal and may transmit the decoded row address signal to the phase change memory array 2 via the first address line 8a. In addition, the control circuit 4 may transmit a column address signal to the column decoder 3b, and the column decoder 3b may decode the column address signal and may transmit the decoded column address signal to the phase change memory array 2 via the second address line 8b. Although not shown, a sense amplifier (not shown) and/or a page buffer (not shown) may be further disposed between the row decoder 3a and the control circuit 4 or between the column decoder 3b and the control circuit 4.

The control circuit 4 may further include a power circuit unit 9. The power circuit unit 9 may perform a function of stably supplying a current and/or voltage to the phase change memory array 2 and may increase or decrease an external voltage to a level suitable for the phase change memory array 2. In addition, the power circuit unit 9 may include a capacitor so as to stably supply a large amount of current and/or a high level of voltage. The capacitor included in the power circuit unit 9 is implemented as a stack type capacitor in the technical idea of the inventive concept, thereby providing a high capacity and high integration capacitor.

Figure 2:
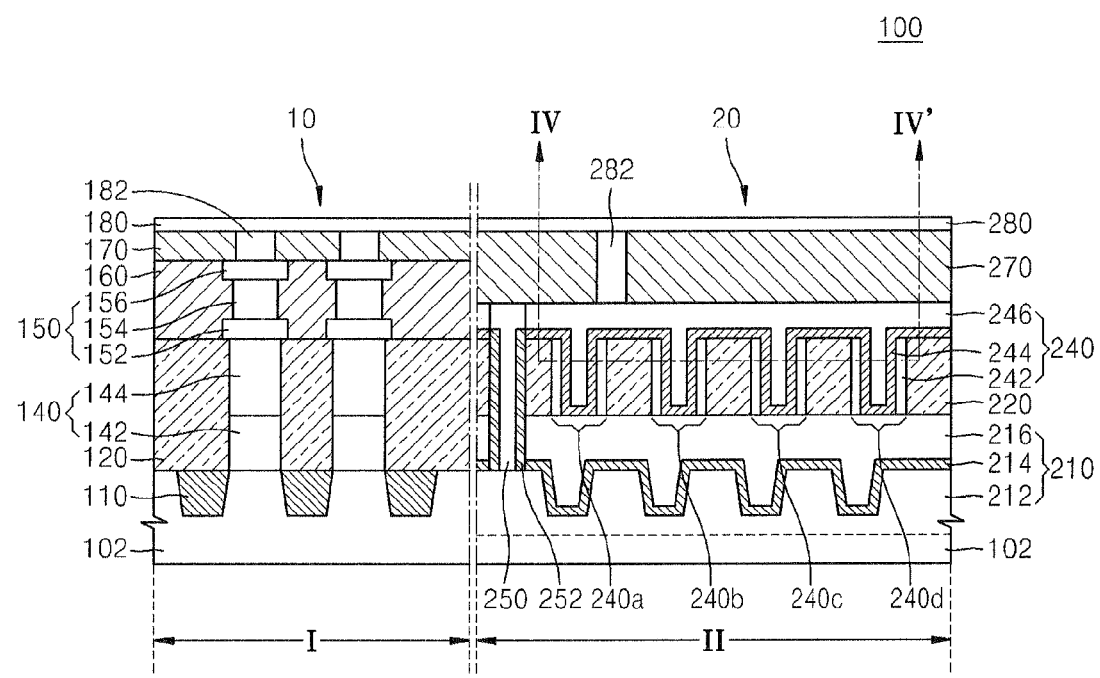
FIG. 2 is a schematic cross-sectional view of a phase change memory device according to some embodiments of the inventive concept.

FIG. 2 is a schematic cross-sectional view of a phase change memory device 100 according to some embodiments of the inventive concept.

Referring to FIG. 2, the phase change memory device 100 may include a phase-change memory structure 10 disposed in a first region I and a capacitor structure 20 disposed in a second region II. The first region I may be a region in which the phase-change memory array (2, see FIG. 1) is formed, and may be referred to as, for example, a cell region. The second region II may be a region in which the control circuit (4, see FIG. 1) or the power circuit unit (9, see FIG. 1) is formed, and may be referred to as, for example, a peripheral region. For example, the second region II may be a region in which a stack type capacitor structure is formed according to the technical idea of the inventive concept.

The phase-change memory structure 10 may include a diode 140 and a storage structure 150 disposed on a portion of a substrate 102. The storage structure 150 may correspond to the memory portion 5 of FIG. 1. The diode 140 may correspond to the access portion 6 of FIG. 1. Alternatively, a transistor may correspond to the access portion 6 of FIG. 1.

A device isolation layer 110 may be disposed on the substrate 102. A first interlayer insulating layer 120 may be disposed on the substrate 102 and the device isolation layer 110. The diode 140 may be disposed on a portion of the substrate 102 between the device isolation layers 110 and/or within the first interlayer insulating layer 120. The diode 140 may include a layer 142 of first conductivity type and a layer 144 of second conductivity type having a different conductivity type from the layer 142, and thus may perform a function as a diode.

A second interlayer insulating layer 160 may be disposed on the first interlayer insulating layer 120. The storage structure 150 may be disposed in the second interlayer insulating layer 160, and may be electrically connected to the diode 140. The lower electrode layer 152, the phase-change material layer 154, and the upper electrode layer 156 may constitute the storage structure 150. Data may be stored in the storage structure 150 according to a material state of the phase-change material layer 154 interposed between the lower electrode layer 152 and the upper electrode layer 156.

A third interlayer insulating layer 170 may be disposed on the second interlayer insulating layer 160. A bitline 180 may be disposed on the third interlayer insulating layer 170. A bitline contact plug 182 may be disposed in the third interlayer insulating layer 170 and may electrically connect the storage structure 150 and the bitline 180.

The capacitor structure 20 is disposed on the second region II of the substrate 102 and may include a first capacitor 210 and a second capacitor 240. The second capacitor 240 may be vertically stacked over the first capacitor 210 and electrically connected in parallel to the first capacitor 210. The first capacitor 210 and the second capacitor 240 may be one of circuit members included in the control circuit 4 of FIG. 1, and included in, for example, the power circuit unit 9 of FIG. 1.

The first capacitor 210 may include a first lower conductive layer 212, a first dielectric layer 214, and a first upper conductive layer 216. The first dielectric layer 214 may be disposed between the first lower conductive layer 212 and the first upper conductive layer 216. The first lower conductive layer 212 may be impurities doped recessed region of the substrate 102. The first upper conductive layer 216 may be a plate layer having a plurality of branches that protrude downwardly from the plate. The first dielectric layer 214 may be disposed on the first lower conductive layer 212 having recessed regions so that the first dielectric layer 214 may have a non-planar plate structure. The first upper conductive layer 216 may be disposed on the first dielectric layer 214. The resulting structure of the first capacitor 210 may be a nonplanar-structure capacitor. Alternatively, the first lower conductive layer 212 may be formed by using a planar plate of conductive material, such as metal, on the substrate 102. The resulting structure of the first capacitor 210 may be a planar-structure capacitor.

The second capacitor 240 may be formed on the first upper conductive layer 216 of the first capacitor 210 and may include a plurality of unit capacitors 240a~240d. Each of the plurality of unit capacitors 240a~240d may be defined by a capacitor insulating layer 242. For example, each of the unit capacitors 240a~240d may be disposed between two neighboring the capacitor insulating layer 220 that is formed on the first upper conductive layer 216.

The unit capacitors 240a~240d may include a portion of upper surface of the first upper conductive layer 216, a second lower conductive layer 242, a second dielectric layer 244, and a second upper conductive layer 246. The combined structure of the second lower conductive layer 242 and the portion of upper surface of the first upper conductive layer 216 may constitute a lower electrode of the second capacitor 240. The first upper conductive layer 216 may be disposed on inner sidewalls of two neighboring capacitor insulating layer. The second dielectric layer 244 may be disposed on the combined structure of the lower electrode 216 and 242. The second dielectric layer 244 may also be disposed on top of the capacitor insulation layer 220. As a result, the second dielectric layer 244 may be disposed on the first upper conductive layer 216, the second lower conductive layer 242, and the capacitor insulation layer 220. The second upper conductive layer 246 may be disposed on the second dielectric layer 244. The second dielectric layer disposed between the capacitor insulation layer 220 and the second upper conductive layer 216 may not serve as a capacitor.

The second upper conductive layer 246 may be disposed on the second dielectric layer 244. The second upper conductive layer 246 may be a plate layer having a plurality branches that protrude downwardly from the plate layer. The second capacitor 240 may be electrically connected to the first lower conductive layer 212 through a first contact plug 250. The first contact plug 250 may be formed through the capacitor insulating layer 220, the first upper conductive layer 216, and the first dielectric layer 214. The first contact plug 250 may be insulated from the first upper conductive layer 216 by a sidewall insulating layer 252.

The first capacitor 210 and the second capacitor 240, vertically stacked on each other, are electrically connected in parallel to each other using a conductive layer structure according to the inventive concept. The first upper conductive layer 216 and the second lower conductive layer may constitute a first common electrode of the capacitors 210 and 240. The first lower conductive layer 212 and the second upper conductive layer 246 connected through the first contact plug 250 may constitute a second common electrode of the capacitors 210 and 240.

The first capacitor 210 and the second capacitor 240 may be electrically connected to the phase-change memory structure 10. For example, the first capacitor 210 and the second capacitor 240 may be electrically connected to the diode 140 and/or the storage structure 150 of the phase-change memory structure 10 through the substrate 102. Alternatively, the first capacitor 210 and the second capacitor 240 may be electrically connected to the diode 140 and/or the storage structure 150 of the phase-change memory structure 10 through a wire line 280 and the bit line 180.

A fourth interlayer insulation layer 270 may be disposed between the wire lines 280 and the second capacitor 240. The wire lines 280 may be electrically connected to the second upper conductive layer 246 of the second capacitor 240 via a wire line contact plug 282. The wire line 280 may be electrically connected to the bit line 180 or another device.

Figure 3:
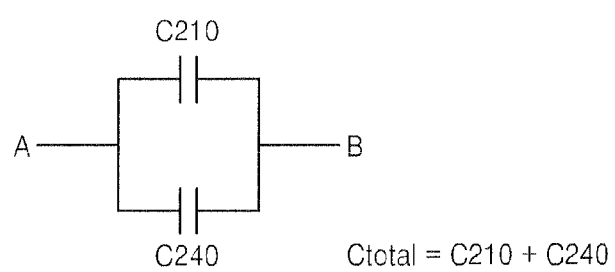
FIG. 3 is a circuit diagram of a capacitor structure of FIG. 2 according to some embodiments of the inventive concept.

FIG. 3 is a circuit diagram of the capacitor structure 20 of FIG. 2 according to some embodiments of the inventive concept. In FIG. 3, "A" denotes an electrical connection to the substrate 102, and "B" denotes an electrical connection to the phase-change memory structure 10. Further, "C210" denotes capacitance of the first capacitor 210, and "C240" denotes capacitance of the second capacitor 240.

Referring to FIG. 3, total capacitance Ctotal of the capacitor structure 20 according to some embodiments of the inventive concept is expressed according to Equation 1 below.

$$Ctotal = C210 + C240 \quad \text{[Equation 1]}$$

That is, the first capacitor 210 and the second capacitor 240 are electrically connected in parallel to each other, and thus the total capacitance Ctotal of the capacitor structure 20 may be a sum of capacitance C210 of the first capacitor 210 and capacitance C240 of the second capacitor 240.

As shown in FIG. 2, the second capacitor 240 is vertically stacked on the first capacitor 210, thereby forming a capacitor region having greater capacitance per unit area. Thus, the phase-change memory device 100 may have a smaller chip size compared to a phase-change memory using a single layered capacitor.

FIGS. 4 through 7 are schematic cross-sectional top views of illustrating various structures of the second capacitor 240 taken along the line IV-IV' of FIG. 2 according to some embodiments of the inventive concept.

Figure 4:
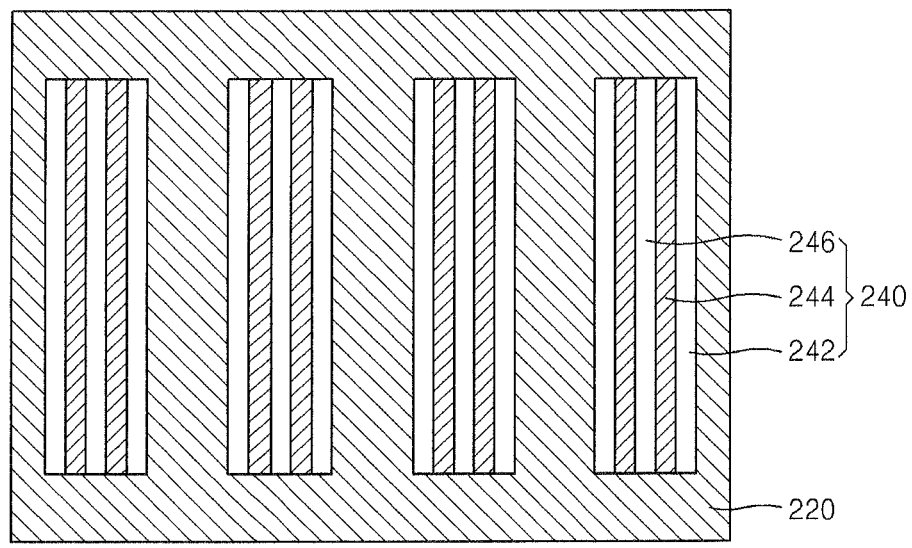
FIGS. 4 through 7 are schematic cross-sectional views of illustrating a uppermost structure of a second capacitor taken along the line IV-IV' of FIG. 2.

FIG. 4 is a schematic cross-sectional top view of illustrating the plurality of unit capacitors 240a~240d of the second capacitor 240. Each of the plurality of unit capacitors 240a~240d may include the second dielectric layer 244 of having a two-parallel-plates shape. The two parallel plates of the second dielectric layer 244 may be disposed between the second lower conductive layer 242 and the second upper conductive layer 246. The second lower conductive layer 242 and the second upper conductive layer 246 are substantially parallel interdigitated branches that extrude upwardly from the first lower conductive layer 216 and extrude downwardly from the second upper conductive layer 246, respectively.

Figure 5:
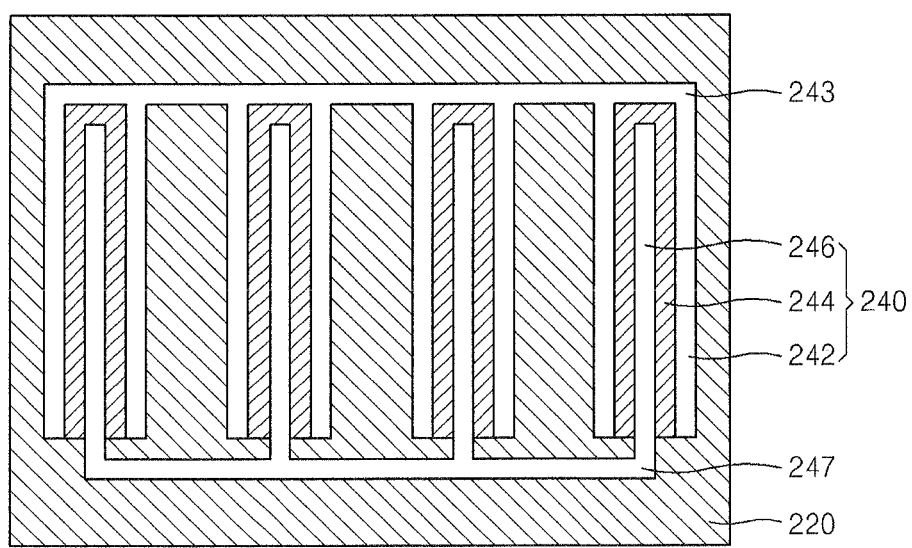

FIG. 5 is another schematic cross-sectional top view of illustrating the plurality of unit capacitors 240a~240d of the second capacitor 240. Each of the plurality of unit capacitors 240a~240d may include the second dielectric layer 244 of having an U-shaped plate. The second dielectric layer 244 may be disposed between the second lower conductive layer 242 and the second upper conductive layer 246. The second lower conductive layer 242 and the second upper conductive layer 246 are substantially parallel interdigitated branches that extrude upwardly from the first lower conductive layer 216 and extrude downwardly from the second upper conductive layer 246, respectively. The branches of the second lower conductive layer 242 may be connected a lower side connection portion 243 that extrude upwardly from the first upper conductive layer 216. The branches of the second upper conductive layer 246 may be connected to an upper side connection portion 247 that extrude downwardly from the second upper conductive layer 246. The upper side connection portion 247 may be disposed to the opposite side of the lower side connection portion 243.

Figure 6:
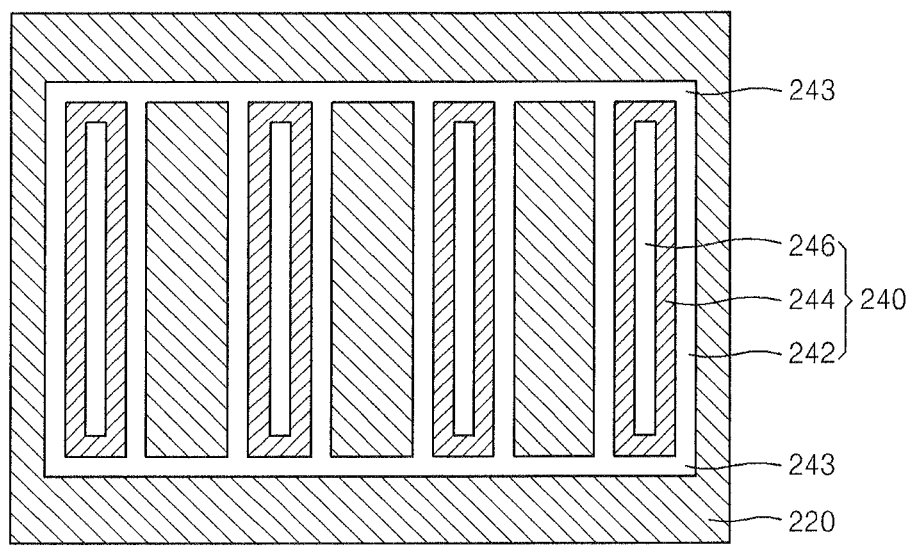

FIG. 6 is another schematic cross-sectional top view of illustrating the plurality of unit capacitors 240a~240d of the second capacitor 240. Each of the plurality of unit capacitors 240a~240d may include the second dielectric layer 244 of having a circular-shaped plate. The second dielectric layer 244 may be disposed between the second lower conductive layer 242 and the second upper conductive layer 246. The second lower conductive layer 242 and the second upper conductive layer 246 are substantially parallel interdigitated branches that extrude upwardly from the first lower conductive layer 216 and extrude downwardly from the second upper conductive layer 246, respectively. The branches of the second lower conductive layer 242 may be connected at both ends of the branches to a lower side connection portion 243 that extrude upwardly from the first upper conductive layer 216. The branches of the second upper conductive layer 246 may be disposed on inside the circular-shaped plate of the second dielectric layer 244.

Figure 7:
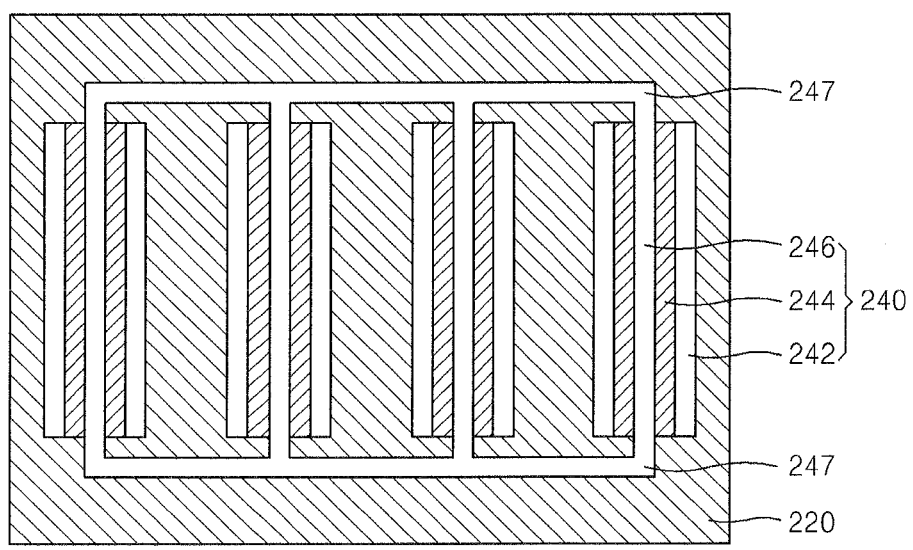

FIG. 7 is still another schematic cross-sectional top view of illustrating the plurality of unit capacitors 240a~240d of the second capacitor 240. Each of the plurality of unit capacitors 240a~240d may include the second dielectric layer 244 of having a two-parallel-plates shape. The second dielectric layer 244 may be disposed between the second lower conductive layer 242 and the second upper conductive layer 246. The second lower conductive layer 242 and the second upper conductive layer 246 are substantially parallel interdigitated branches that extrude upwardly from the first lower conductive layer 216 and extrude downwardly from the second upper conductive layer 246, respectively. The branches of the second upper conductive layer 246 may be connected each other at both ends of the branches to an upper side connection portion 247 that extrude downwardly from the second upper conductive layer 246.

FIGS. 8 through 19 are schematic cross-sectional views of illustrating a method for manufacturing the phase change memory device 100 of FIG. 2 according to some embodiments of the inventive concept.

Figure 8:
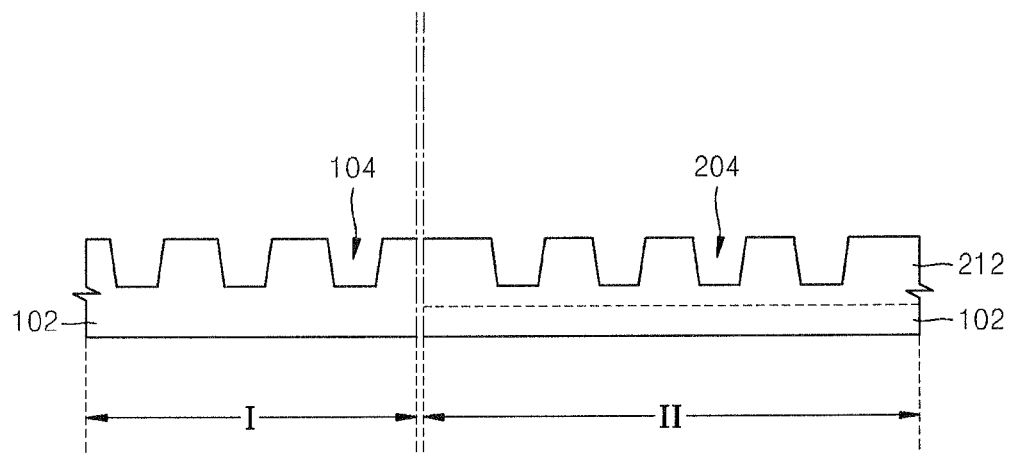
FIGS. 8 through 19 are schematic cross-sectional views of illustrating a method for manufacturing a phase change memory device of FIG. 2 according to some embodiments of the inventive concept.

Referring to FIG. 8, the substrate 102 including the first region I and the second region II is prepared. The substrate 102 may include a dielectric layer including silicon oxide, titanium oxide, aluminum oxide, zirconium oxide, or hafnium oxide, a conductive layer including titanium (Ti), titanium nitride (TiN), aluminum (Al), tantalum (Ta), tantalum nitride (TaN) and/or titanium aluminum nitride (TiAlN), or a semiconductor layer formed of silicon (Si), silicon-germanium (SiGe), and/or silicon carbide (SiC). In addition, the substrate 102 may include an epitaxial layer, a silicon-on-insulator (SOI) layer, and/or a semiconductor-on-insulator (SEOI) layer.

Thereafter, a first trench 104 is formed in the first region I and a second trench 204 is formed in the second region II by recessing a portion of the substrate 102. The first trench 104 and the second trench 204 may be formed by using lithography and etching processes. The first trench 104 and the second trench 204 may be formed simultaneously by using the same process or may be formed separately using different processes. The first trench 104 and the second trench 204 may have the same size, for example, the same depth and/or width or different sizes. The substrate 102 disposed in the second region II may include impurities and thus the substrate 102 may be conductive. For example, an upper region 212 of the substrate 102 may be doped to include impurities and disposed in a bottom and a sidewall of the second trench 204. The upper region 212 having doped impurities may function as a lower electrode of a capacitor. The upper region 212 is referred to as the first lower conductive layer 212 below. Although not shown, the substrate 102 disposed in the first region I may include an impurity region (not shown) including impurities.

Figure 9:
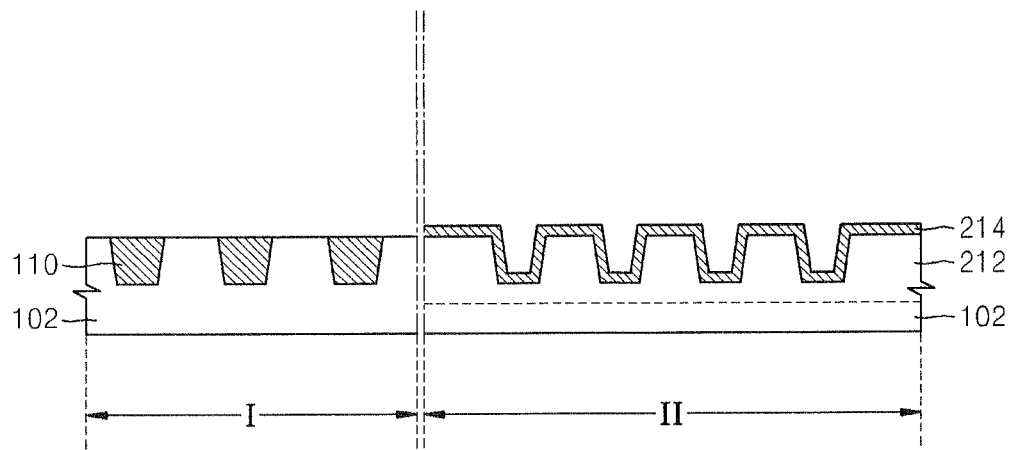

Referring to FIG. 9, the device isolation layer 110 may be formed for filling the first trench 104 of the substrate 102. The first dielectric layer 214 may be conformally formed on the bottom and the sidewall of the second trench 204 of the substrate 102 to a predetermined thickness, where the first dielectric layer 214 may not fill the second trench 204. The device isolation layer 110 and the first dielectric layer 214 may include an insulating material, for example, an oxide, a nitride, or an oxynitride and may include at least one selected from the group consisting of silicon oxide, silicon nitride, and silicon oxynitride. The first dielectric layer 214 may include a high dielectric constant material high-k, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), and hafnium aluminum oxide (HfAlO). The device isolation layer 110 and the first dielectric layer 214 may include the same material or different materials. The device isolation layer 110 and the first dielectric layer 214 may be formed simultaneously by using the same process or may be formed separately using different processes The device isolation layer 110 and the first dielectric layer 214 may be formed by using sputtering, chemical vapor deposition (CVD), plasma enhanced CVD (PECVD), atomic layer deposition (ALD), or the like. In addition, the device isolation layer 110 and the first dielectric layer 214 may be formed by using a photolithography method, an etch method, chemical mechanical polishing (CMP), or a planarization process using dry etch.

Figure 10:
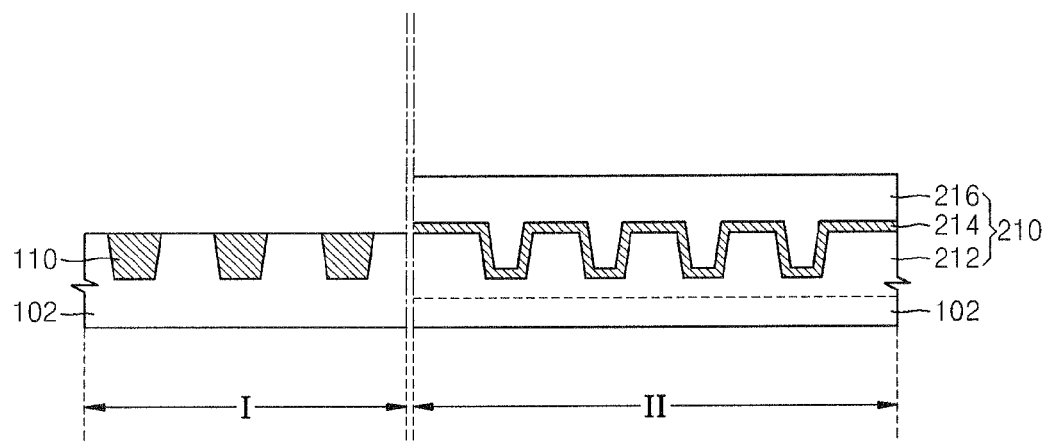

Referring to FIG. 10, the first upper conductive layer 216 is formed on the first dielectric layer 214. The first upper conductive layer 216 may fill in the second trench 204. The first upper conductive layer 216 may include a conductive material. The first upper conductive layer 216 may include, for example, polysilicon. The first upper conductive layer 216 may include a metal, such as aluminum (Al), copper (Cu), tungsten (W), titanium (Ti), and tantalum (Ta), an alloy such as titanium tungsten (TiW), titanium aluminum (TiAl), or nitrides of the metal and the alloy. In the present embodiment, the first upper conductive layer 216 may include polysilicon, epitaxially grown from the first dielectric layer 214.

The first lower conductive layer 212, the first dielectric layer 214, and the first upper conductive layer 216 may constitute the first capacitor 210. The first dielectric layer 214 may be disposed between the first lower conductive layer 212 and the first upper conductive layer 216 and electrically insulate the first lower conductive layer 212 from the first upper conductive layer 216.

Figure 11:
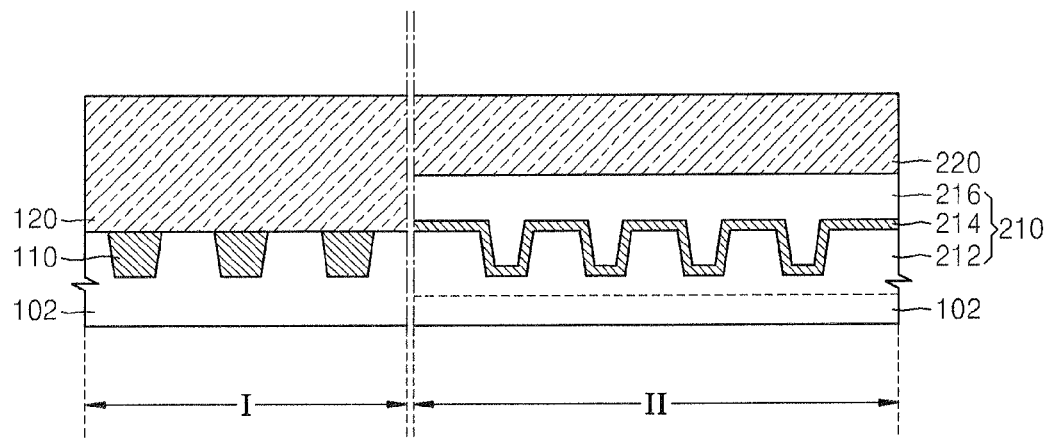

Referring to FIG. 11, the first interlayer insulation layer 120 is formed on the substrate 102 of the first region I. The capacitor interlayer insulating layer 220 is also formed on the first upper conductive layer 216 of the second region II. The first interlayer insulation layer 120 and the capacitor interlayer insulating layer 220 may include insulation materials, for example, an oxide, a nitride, or an oxynitride, and may include at least one selected from the group consisting of silicon oxide, silicon nitride, and silicon oxynitride. The first interlayer insulation layer 120 and the capacitor interlayer insulating layer 220 may include the same material or different materials. The first interlayer insulation layer 120 and the capacitor interlayer insulating layer 220 may be formed simultaneously by using the same process or may be formed separately using different processes. After forming the first interlayer insulation layer 120 and the capacitor interlayer insulating layer 220, a process of planarizing, for example a CMP process or an etch-back process, the first interlayer insulation layer 120 and the capacitor interlayer insulating layer 220 may be further performed.

Figure 12:
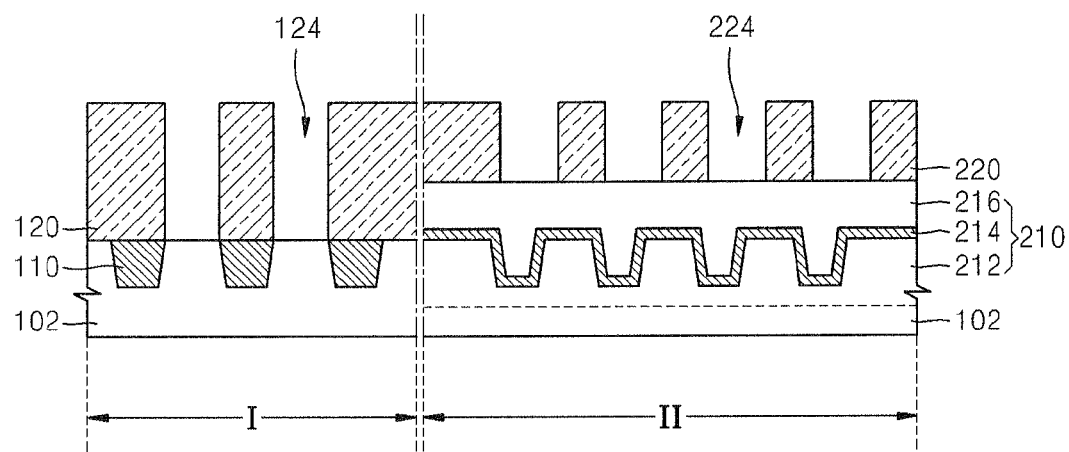

Referring to FIG. 12, a first opening portion 124 may be formed to expose the substrate 102 disposed between the device isolation layers 110 by removing a portion of the first interlayer insulation layer 120. A second opening portion 224 may also be formed to expose the first upper conductive layer 216 by removing a portion of the capacitor interlayer insulating layer 220. The first opening portion 124 and the second opening portion 224 may be formed by using lithography and etching processes. The first opening portion 124 and the second opening portion 224 may be formed simultaneously by using the same process or may be formed separately using different processes. The first opening portion 124 and the second opening portion 224 may have the same size, for example, the same depth and/or width, or different sizes.

Figure 13:
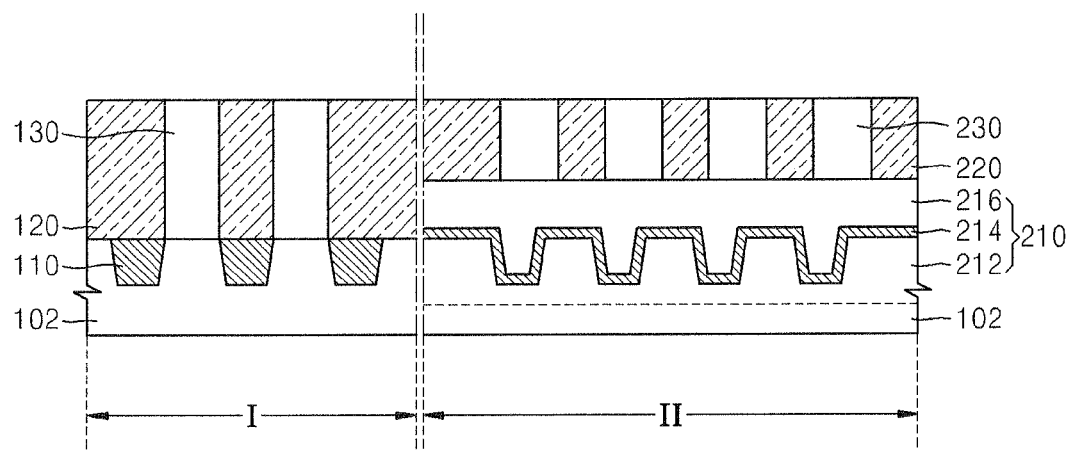

Referring to FIG. 13, a filling layer 130 may be formed on the exposed substrate 102, filling in the first opening portion 124. A filling layer 230 may also be formed on the exposed first upper conductive layer 216, filling in the second opening portion 224 are formed. The filling layers 130 and 230 may include, for example, polysilicon. The filling layers 130 and 230 may be formed by using a deposition or growth method. For example, the filling layer 130 that grows on the substrate 102 may include crystalline silicon. The filling layer 230 that grows on the first upper conductive layer 216 may include polysilicon. Alternatively, the filling layer 230 that grows on the first upper conductive layer 216 may include amorphous silicon.

Figure 14:
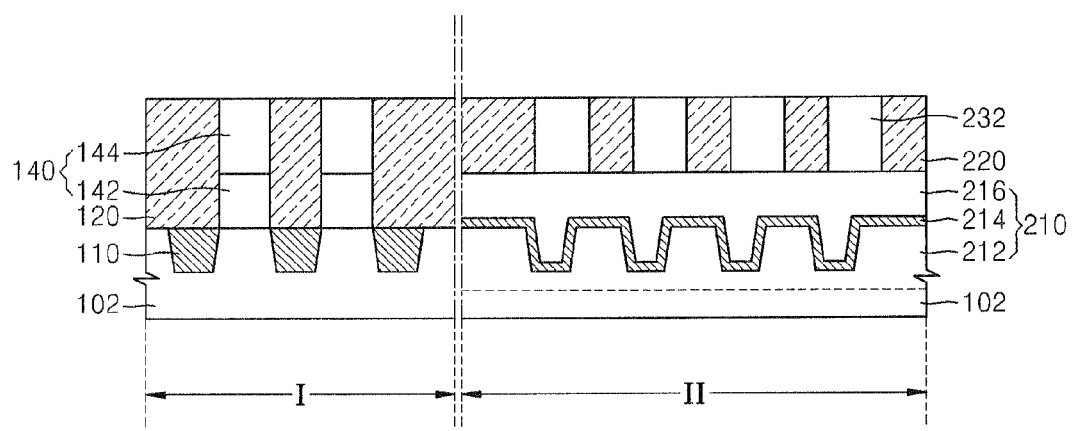

Referring to FIG. 14, the diode 140 is formed by using the filling layer 130 of the first region I. The diode 140 may include the layer 142 of a first conductivity type and the layer 144 of a second conductivity type, where the first and second conductivity types are different from each other. For example, the first conductivity type may be a p-type conductive type, and the second conductivity type may be an n-type conductive type, or vice versa. The layer 142 of first conductivity type may be formed by previously doping first conductivity impurities in the substrate 102, forming the filling layer 130, and diffusing the first conductivity impurities from the substrate 102. The layer 144 of second conductivity type may be formed by forming a layer (not shown) having second conductivity type impurities on the filling layer 130, and diffusing the second conductivity impurities from the layer (not shown) having the second conductivity impurities. Alternatively, the layer 142 of first conductivity type and/or the layer 144 of second conductivity type may be formed by an ion-implantation process.

A filling layer 232 is formed by doping impurities in the filling layer 230 of the second region II. The doping impurities may be the first conductivity impurities or the second conductivity impurities. The doped filling layer 232 may have conductivity.

Figure 15:
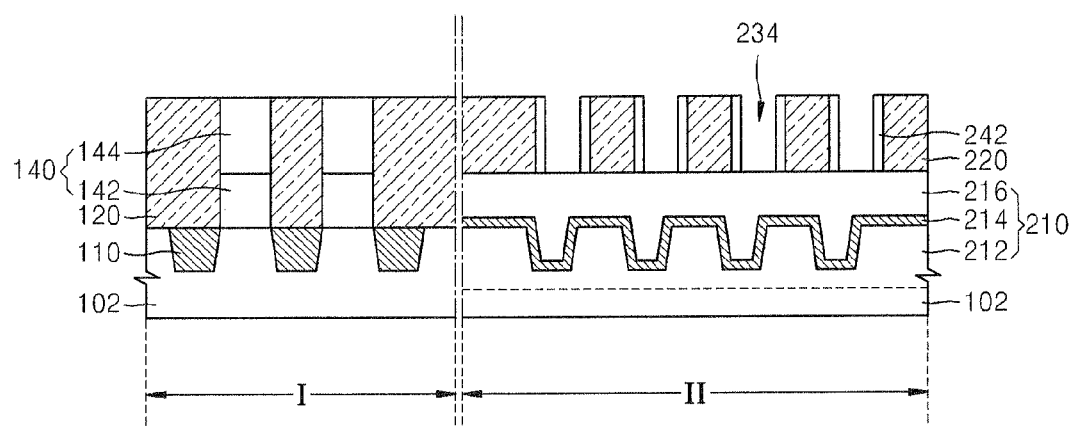

Referring to FIG. 15, a second lower conductive layer may be formed on the sidewall of the capacitor insulating layer 220 by etching a portion of the doped filling layer 232 to form a third opening portion 234. The doped filling layer 232 may be left on the sidewall of the capacitor insulating layer 220 and forms the second lower conductive layer 242. The second lower conductive layer 242 may be electrically connected to the first upper conductive layer 216, and thus the second lower conductive layer 242 may be electrically connected to the first upper conductive layer 216. The first region I may be covered by a mask layer (not shown) to protect the first region I from the etching process of forming the second lower conductive layer of the second region II.

Figure 16:
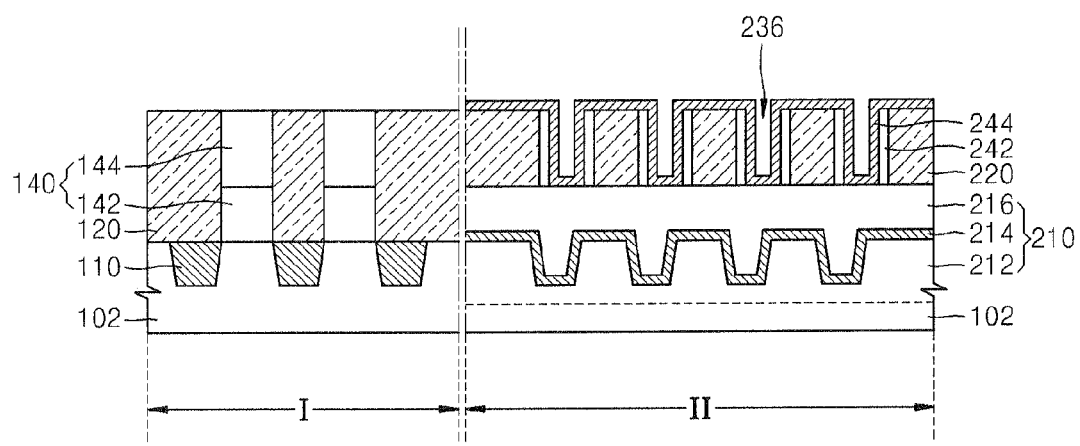

Referring to FIG. 16, the second dielectric layer 244 may be conformally formed on the first upper conductive layer 216 and the second lower conductive layer 242. The second dielectric layer 244 may also be formed on uppermost top surface of the capacitor insulating layer 220. The second dielectric layer 244 may be conformally formed on the bottom and sidewall of the third opening portion 234 without entirely filling the third opening portion 234. The third opening portion 234 not filled by the second dielectric layer 244 may be referred to a forth opening portion 236. Alternatively, the second dielectric layer 244 may be formed by removing a portion of an insulator layer after entirely filling the third opening portion 234 with the insulator layer. The second dielectric layer 244 may be formed by using a material similar to that of the first dielectric layer 214 and/or a method similar to that of the first dielectric layer 214. The second dielectric layer 244 may also be formed on the first interlayer insulating layer 120 and the diode 140 of the first region I during the process of forming the second dielectric layer 244. The second dielectric layer 244 formed on the first region I may be removed for a subsequent process.

Figure 17:
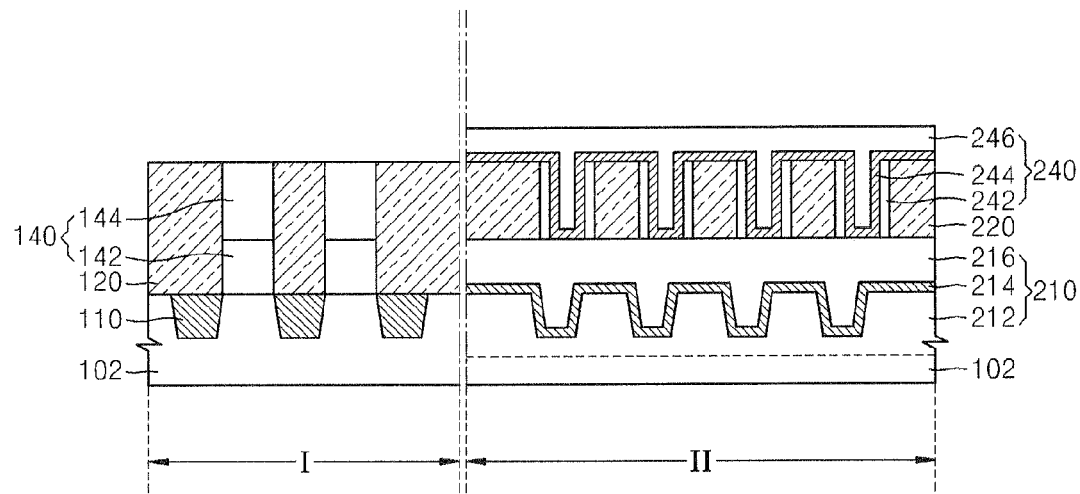

Referring to FIG. 17, the second upper conducive layer 246 is formed on the second dielectric layer 244. The second upper conductive layer 246 may fill in the fourth opening portion 236. The second upper conductive layer 246 may be a conductive layer. The second upper conductive layer 246 may be, for example, polysilicon layer. Alternatively, the second upper conductive layer 246 may be a conductive layer of a metal, such as aluminum (Al), copper (Cu), tungsten (W), titanium (Ti), and tantalum (Ta), an alloy such as titanium tungsten (TiW) and titanium aluminum (TiAl), or nitrides of the metal and the alloy.

The second lower conductive layer 242, the first upper conductive layer 216, the second dielectric layer 244, and the second upper conductive layer 246 may constitute the second capacitor 240.

Figure 18:
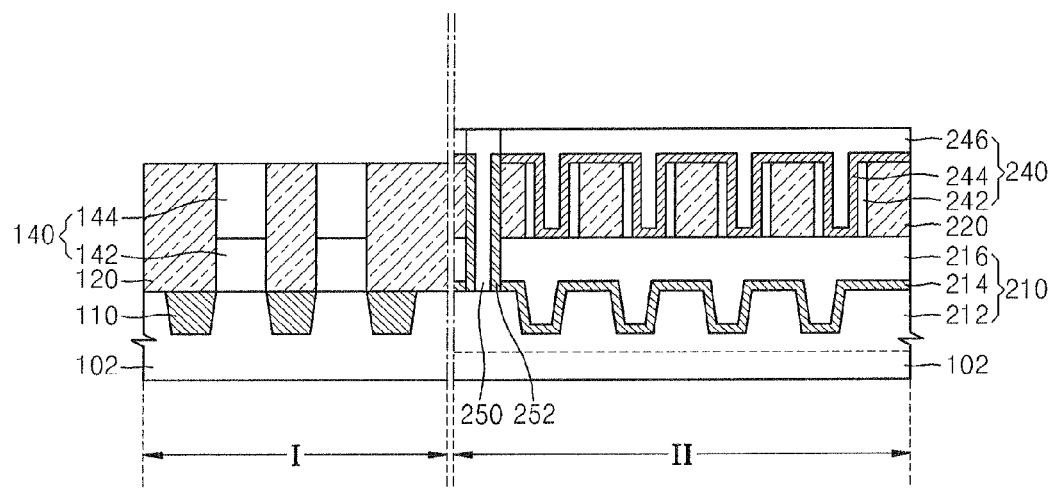

Referring to FIG. 18, the first contact plug 250 is formed for electrically connecting the second upper conductive layer 246 and the first lower conductive layer 212. The first contact plug 250 is insulated from the first upper conductive layer 216 by the sidewall insulating layer 252. The first contact plug 250 may be formed by forming an opening portion (not shown) through which the substrate 102 is exposed, forming the sidewall insulating layer 252 in a portion of a sidewall of the opening portion, and filling the opening portion with a conductive material. Alternatively, the first contact plug 250 may be formed by using the processes described with reference to FIGS. 12 through 17.

Figure 19:
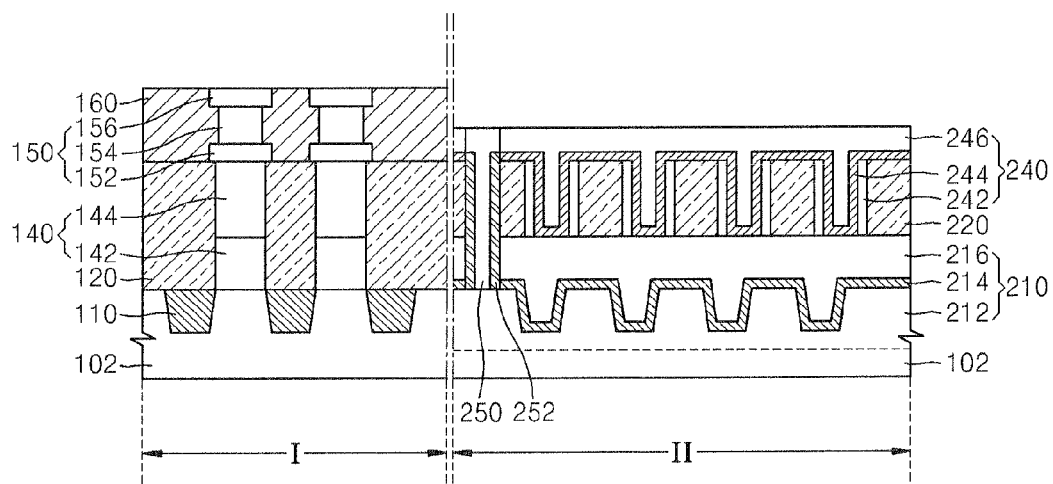

Referring to FIG. 19, the storage structure 150 may be formed on the diode 140 and may be insulated to each other by a second insulating layer 160. The storage structure 150 includes the lower electrode 152, the phase-change material layer 154, and the upper electrode 156. The lower electrode 152 is electrically connected to the diode 140. The phase-change material layer 154 is disposed on the lower electrode 152 and is electrically connected to the lower electrode 152. The upper electrode 156 is disposed on the phase-change material layer 154, and is electrically connected to the phase-change material layer 154.

The lower electrode 152 and/or the upper electrode 156 may include one selected from the group consisting of carbon nitride (CN), titanium nitride (TiN), titanium aluminum nitride (TiAlN), tantalum nitride (TaN), tungsten nitride (WN), molybdenum nitride (MoN), niobium nitride (NbN), titanium silicon nitride (TiSiN), titanium boron nitride (TiBN), zirconium silicon nitride (ZrSiN), cobalt silicon (CoSi), tungsten silicon (WSi), tungsten silicon nitride (WSiN), tungsten boron nitrie (WBN), zirconium aluminum nitride (ZrAlN), molybdenum aluminum nitride (MoAlN), tantalum silicon nitride (TaSiN), tantalum aluminum nitride (TaAlN), titanium oxynitride (TiON), titanium aluminum oxynitride (TiAlON), tungsten oxynitride (WON), tantalum oxynitride (TaON), titanium carbon nitride (TiCN), and tantalum carbon nitride (TaCN). The lower electrode 152 and/or the upper electrode 156 may have an array of extended lines or may have an array of polyhedras separated each other. The lower electrode 152 and/or the upper electrode 156 may have a ring shape whose inside is filled with another material, for example, an insulator. The lower electrode 152 and the upper electrode 156 may be formed by using the same material or different materials.

The phase-change material layer 154 may include phase-change materials that may store data according to crystalline states, as described above, for example, a calcogenide material, and may include at least one selected from the group consisting of Ge—Te, Ge—Sb—Te, Ge—Te—Se, Ge—Te—As, Ge—Te—Sn, Ge—Te—Ti, Ge—Bi—Te, Ge—Sn—Sb—Te, Ge—Sb—Se—Te, Ge—Sb—Te—S, Ge—Te—Sn—O, Ge—Te—Sn—Au, Ge—Te—Sn—Pd, Sb—Te, Se—Te—Sn, Sb—Se—Bi, In—Se, In—Sb—Te, Sb—Se, and Ag—In—Sb—Te. The phase-change material layer 154 may further include a metallic material. Impurities may also be doped in the phase-change material layer. These impurities may be at least one selected from the group consisting of carbon (C), nitrogen (N), silicon (Si), oxygen (O), bismuth (Bi), and tin (Sn). A driving current of a memory device may be reduced due to the impurities doped in the phase-change material layer.

The subsequent processes may include a process of forming the bit line 180 in the first region I and a process of forming the wire line 280 in the second region II.

FIGS. 20 through 23 are schematic cross-sectional views of phase change memory devices 200, 300, 400, and 500, respectively, according to some other embodiments of the inventive concept. The phase change memory devices 200 and 300 of FIGS. 20 through 23 may have the same structures as that of FIG. 2, except for the structure of the first upper conductive layer 216. Therefore, the same reference numerals will be assigned to the identical elements, and redundant description will be omitted.

Figure 20:
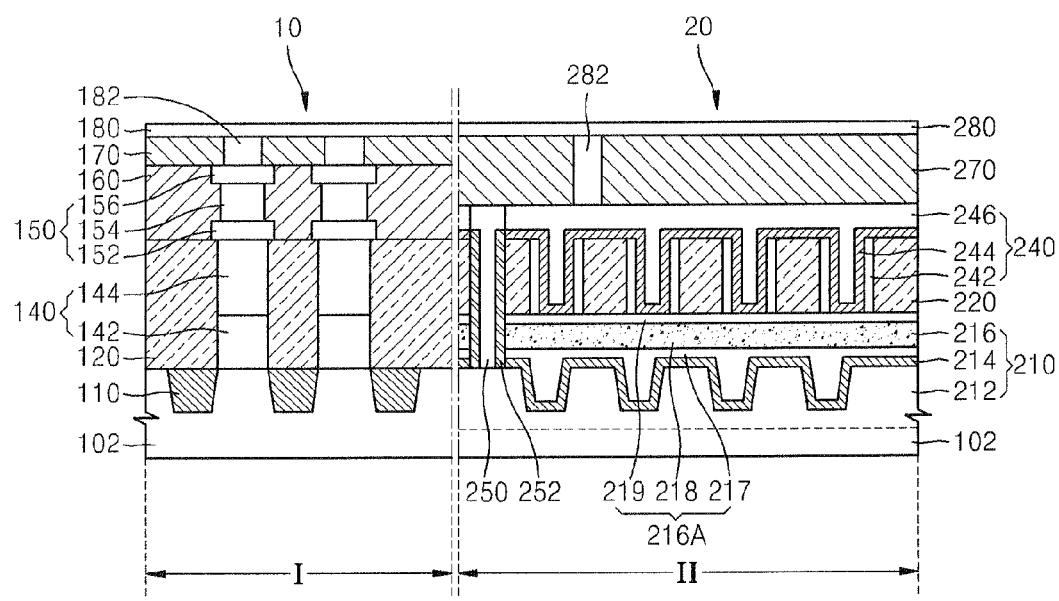
FIGS. 20 through 24 are schematic cross-sectional views of phase change memory devices according to some embodiments of the inventive concept.

Referring to FIG. 20, the phase-change memory device 200 includes a first upper conductive layer 216A of a multi-layered structure according to some embodiments of the inventive concept. The first upper conductive layer 216 may include a base layer 217, a metal layer 218, and a seed layer 219. The base layer 217 may include polysilicon layer disposed on the first dielectric layer 214, filling the second trench 204 (see FIG. 8). The metal layer 218 may be disposed on the base layer 217. The metal layer 218 may include metal, such as aluminum (Al), copper (Cu), tungsten (W), titanium (Ti), and tantalum (Ta), alloy such as titanium tungsten (TiW), titanium aluminum (TiAl), or nitrides of the metal and alloy. The seed layer 219 may be disposed on the metal layer 218. The seed layer 219 may function as a seed layer of the second lower conductive layer 242 of the second capacitor 240. For example, the seed layer 219 may include polysilicon. The second lower conductive layer 242 may be a polysilicon layer grown from the seed layer 219. Accordingly, the second lower conductive layer 242 may be physically and electrically connected to the seed layer 219 and thus the second lower conductive layer 242 may be electrically connected to the first upper conductive layer 216A. The seed layer 219 may also function as an etching prevention layer. The seed layer 218 may prevent the metal layer 218 from being etched or contaminated during subsequent processes. For example, when the second opening portion 224 of FIG. 12 is formed, the metal layer 218 may not be contaminated from the etching process because the seed layer 219 protects the metal layer 219. In effect, the first upper conductive layer of the multi-layered structure having the metal layer 218 may reduce resistance of the first and second capacitors 210 and 240.

Figure 21:
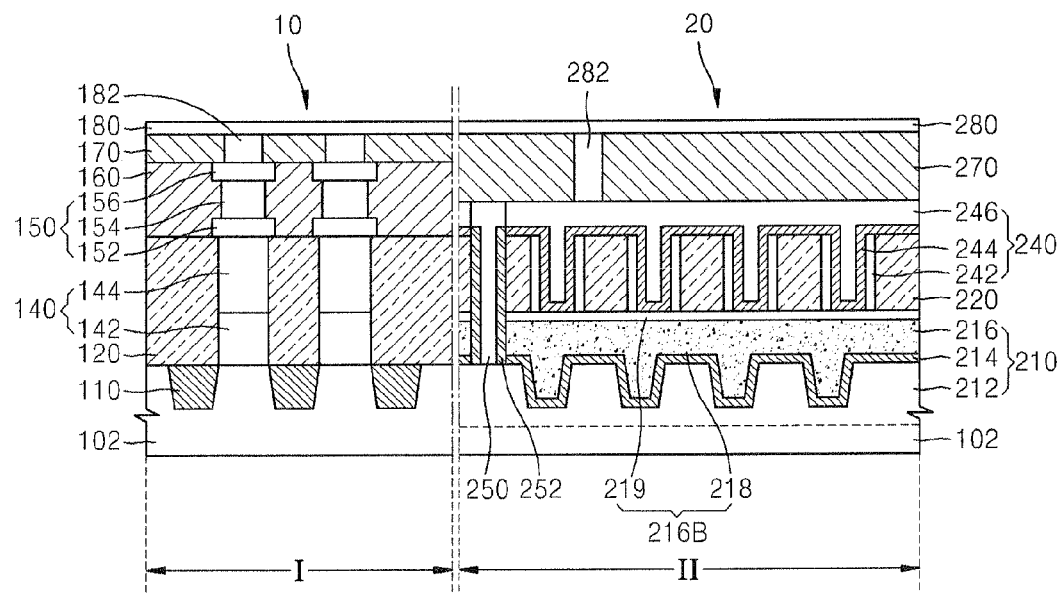

The phase-change memory device 300 of FIG. 21 may include a first upper conductive layer 216B having an alternative structure of the first upper conductive layer 216A of FIG. 20. The first upper conductive layer 216B may include the metal layer 218 and the seed layer 219. In this embodiment, the metal layer 218 may be directly disposed on the first dielectric layer 214, filling the second trench 204 (see FIG. 8).

Figure 22:
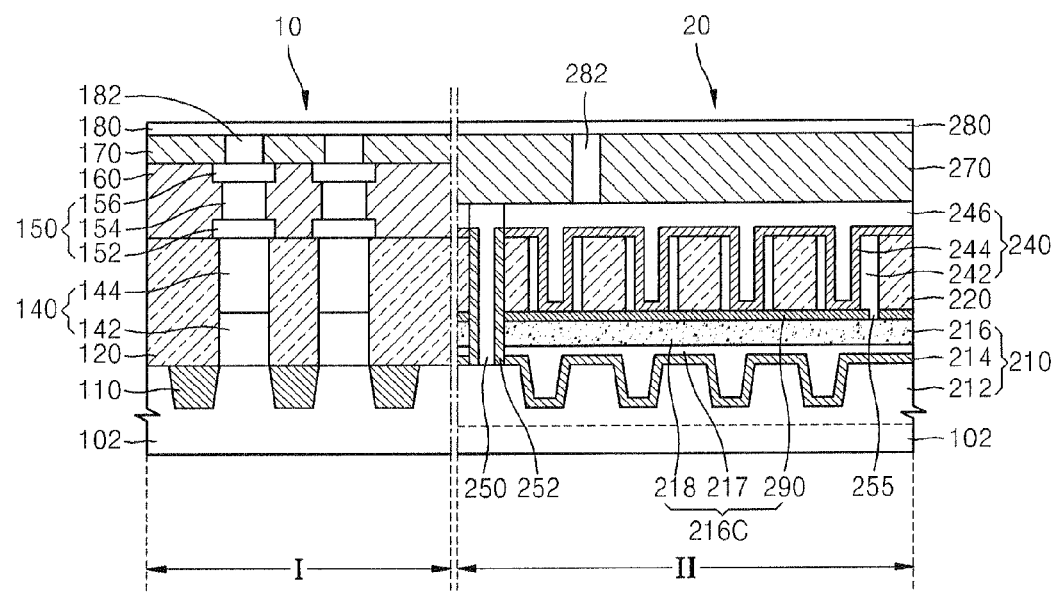

The phase-change memory device 400 of FIG. 22 may include a first upper conducive layer 216C including an insulating layer 290, a metal layer 218 and a base layer 217 (babo) according to some embodiments of the inventive concept. The insulating layer 290 may be disposed on the metal layer 218, insulating the metal layer 218 from the second lower conductive layer 242 and protecting the metal layer 218 from being contaminated during subsequent process steps. (babo) The insulating layer 290 may include an insulating material, for example, an silicon oxide, a silicon nitride, or a silicon oxynitride. The insulating layer 290 may function as an etching prevention layer so as to prevent the metal layer 218 from being exposed when the second opening portion 224 of FIG. 12 is formed. The insulating layer 290 may further include the second contact plug 255 through which the metal layer 218 is electrically connected to the second lower conductive layer 242.

Figure 23:
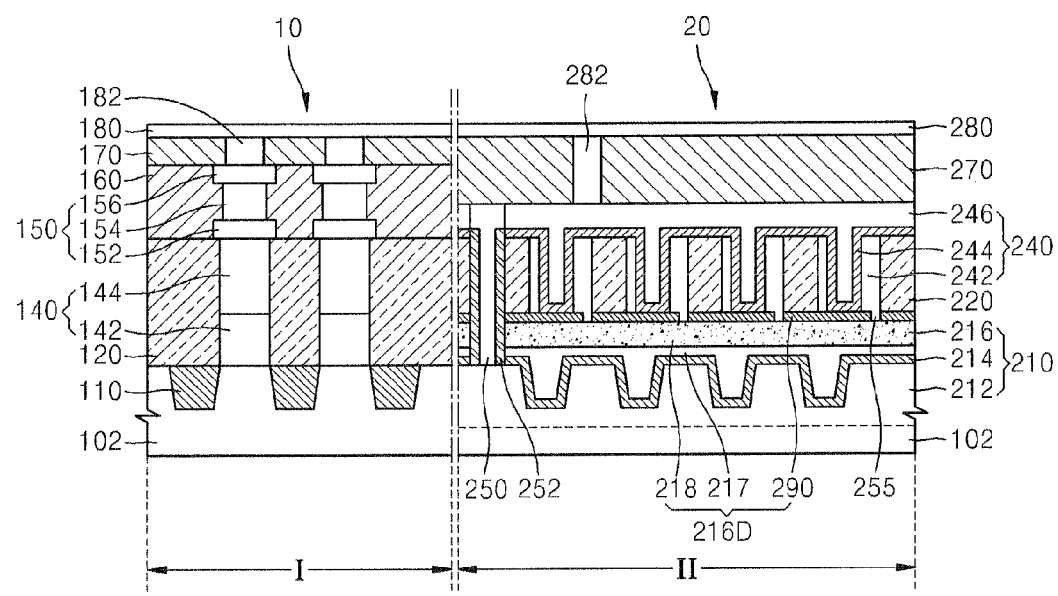

The phase-change memory device 500 of FIG. 23 may also include a first upper conducive layer 216C including an insulating layer 290, a metal layer 218 and a base layer 217 according to some embodiments of the inventive concept. Unlike the phase-change memory device 400 of FIG. 22 having one second contact plug 255, the second lower conductive layer 242 may be electrically and/or physically connected to the metal layer 218 through a plurality of second contact plugs 255.

Figure 24:
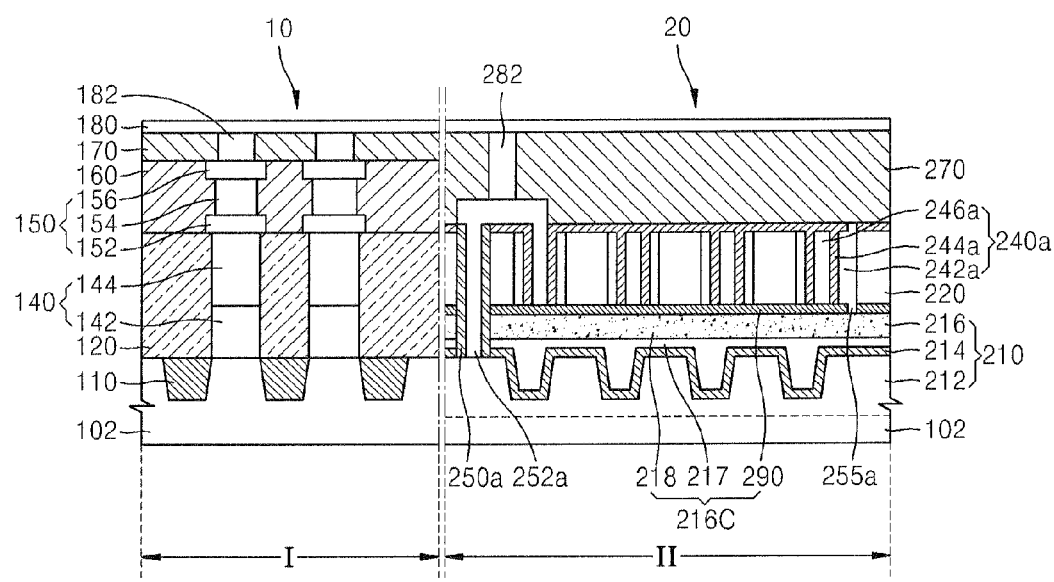
Figure 25:
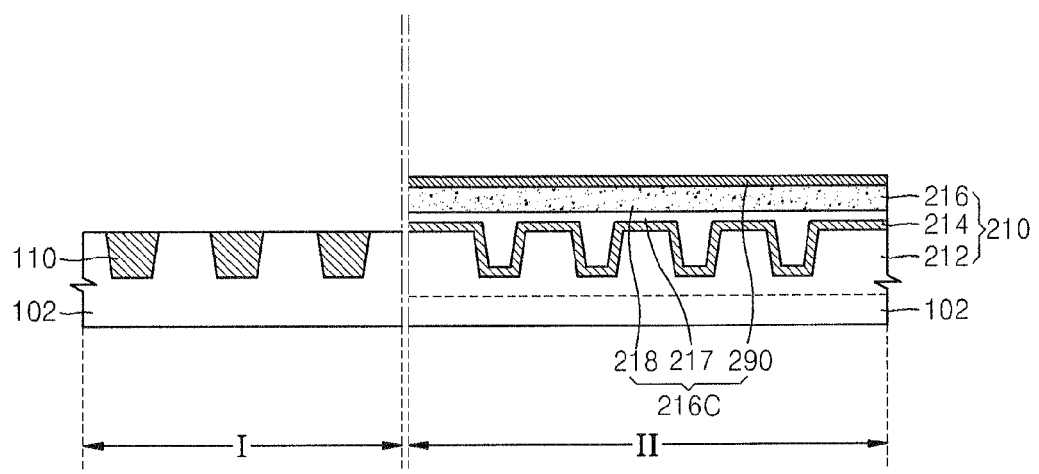
FIGS. 25 through 32 are schematic cross-sectional views of illustrating a method for manufacturing a phase change memory device of FIG. 32 according to some embodiments of the inventive concept.

FIG. 24 is a schematic cross-sectional view of a phase change memory device 600 according to some other embodiments of the inventive concept. The phase change memory device 600 may have the same structures as that of FIG. 22, except for the structure of the second dielectric layer 244 and the wire line contact plug 282 of the phase-change memory device 500 of FIG. 22. Therefore, the same reference numerals will be assigned to the identical elements, and redundant description will be omitted. The difference will be explained in describing a manufacturing methods of the phase-change memory device 600.

FIGS. 25 through 32 are schematic cross-sectional views of illustrating a method of manufacturing the phase change memory device 600 according to some embodiments of the inventive concept. The method of manufacturing the phase-change memory device 600 will be explained using the structure of FIG. 9.

Referring to FIG. 24, a first upper conductive layer 216C is formed on the first dielectric layer 214. The first upper conductive layer 216C may include the base layer 217, the metal layer 218 and an insulation layer 290, where the layers 217, 218 and 290 are disposed on each other. Alternatively, the first upper conductive layer 216 may include the metal layer 218 and the insulation layer 290 disposed on each other. In another embodiment, the first upper conductive layer 216 may be a single material layer such as polysilicon layer.

Figure 26:
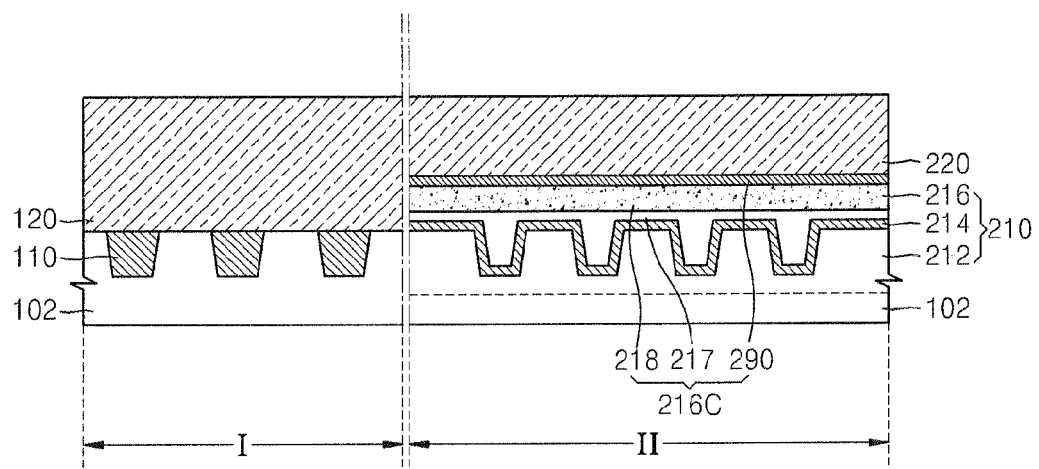

Referring to FIG. 26, the capacitor insulating layer 220 is formed on the first capacitor 210 of the second region II. That is, the capacitor interlayer insulation layer 220 is formed on the insulation layer 290. The insulation layer 290 and the capacitor insulation layer 220 may have different etching selection ratios.

Figure 27:
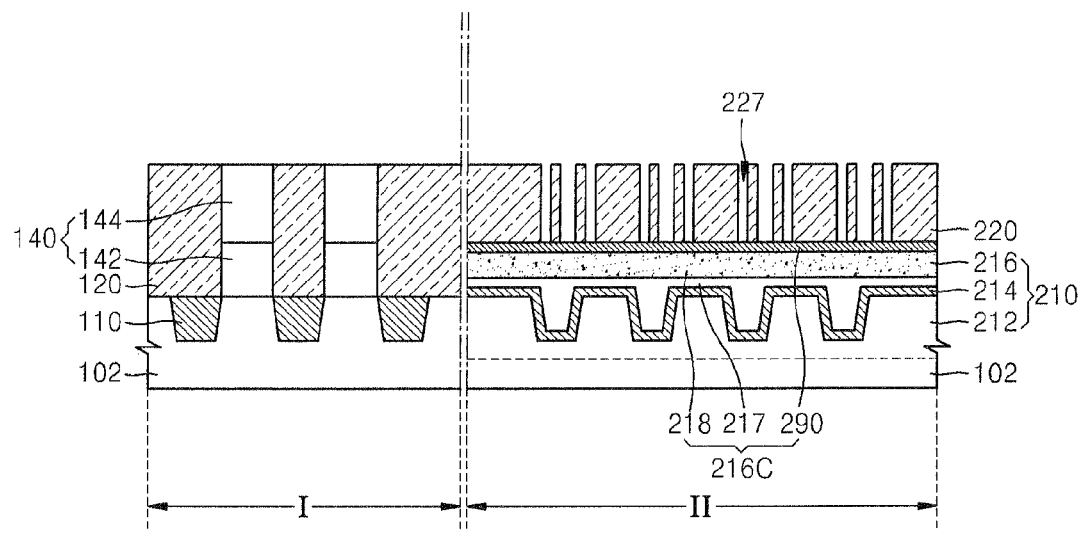

Referring to FIG. 27, a fifth opening portion 227 may be formed to expose the insulation layer 290 by removing a portion of the capacitor interlayer insulation layer 220.

Figure 28:
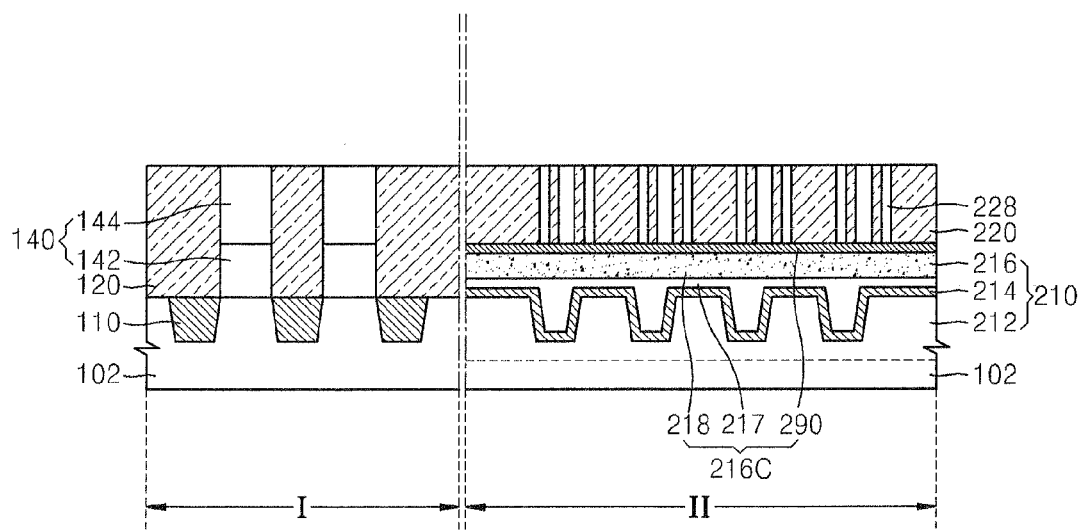

Referring to FIG. 28, conductive layers 228 are formed by filling the fifth opening portion 227 with a conductive material. The conductive layers 228 have shapes upwardly protruding from the insulation layer 290. The conductive layers 228 may be formed by using a deposition method when the metal layer 218 and/or the insulation layer 290 are included in the conductive layers 228. Alternatively, when the first upper conductive layer 216 may include polysilicon layer at its top layer or the first upper conductive layer 216 may be a single polysilicon layer, the conductive layers 228 may be formed by using a method of growing the conductive layers 228 from the first upper conductive layer 216.

Figure 29:
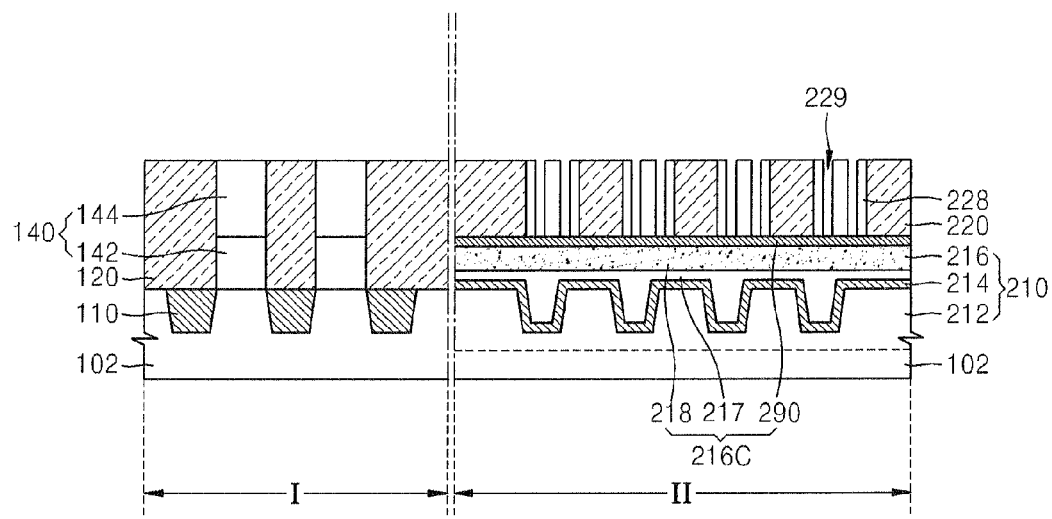

Referring to FIG. 29, a sixth opening portion 229 is formed by removing the capacitor insulation layer 220 between the conductive layers 228.

Figure 30:
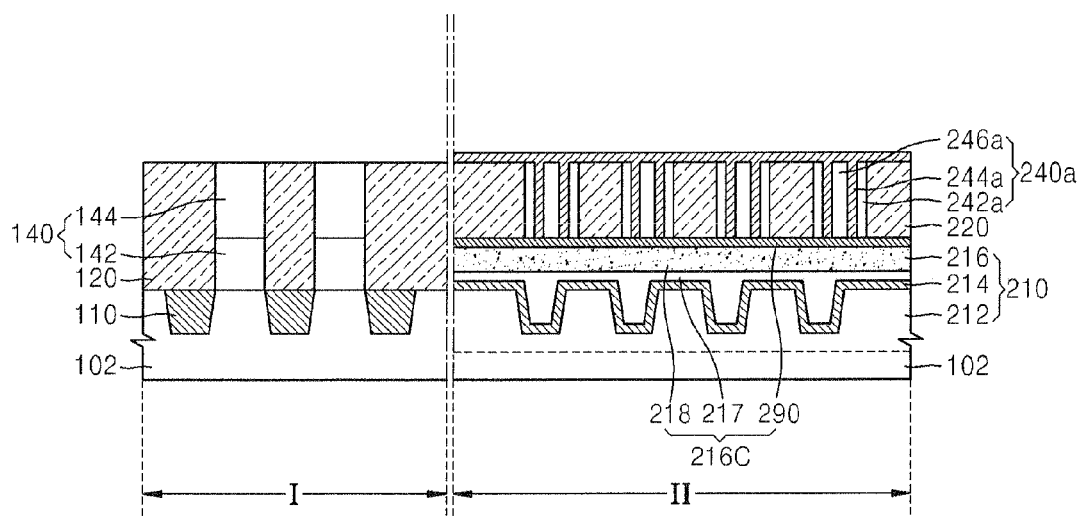

Referring to FIG. 30, a second dielectric layer 244a may be conformally formed on the capacitor insulation layer 220, the conductive layers 228, and the insulation layer 290. The conformal deposition of the second dielectric layers 244a may fill the sixth opening portion 229 with a dielectric material. The conductive layers 228 may constitute second lower conductive layers 242a and second upper conductive layers 246a that are electrically insulated by the second dielectric layers 244a. The second dielectric layers 244a may be formed on both sidewalls of one of the second upper conductive layers 246a. The second lower conductive layers 242a may be formed between the capacitor insulation layer 220 and the second dielectric layers 244a. The second lower conductive layers 242a, the second dielectric layers 244a, and the second upper conductive layers 246a may constitute the second capacitor 240a.

Figure 31:
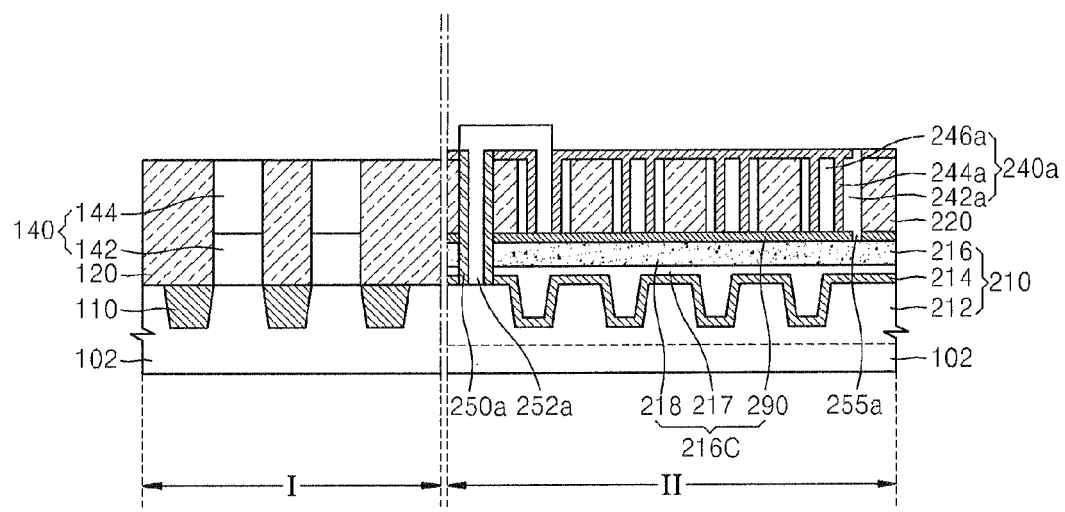

Referring to FIG. 31, a first contact plug 250a that electrically connects the second upper conductive layers 246a of the second capacitor 240a and the first lower conductive layer 212 of the first capacitor 210 is formed. The first contact plug 250a is insulated from the first upper conductive layer 216 by a sidewall insulation layer 252a. A second contact plug 255a may be formed to electrically connect the second lower conductive layers 242a of the second capacitor 240a and the first upper conductive layer 216 of the first capacitor 210. The connection between the second lower conductive layers 242a and the second upper conductive layers 246a and arrangement thereof apply the embodiments described with reference to FIGS. 4 through 7.

Figure 32:
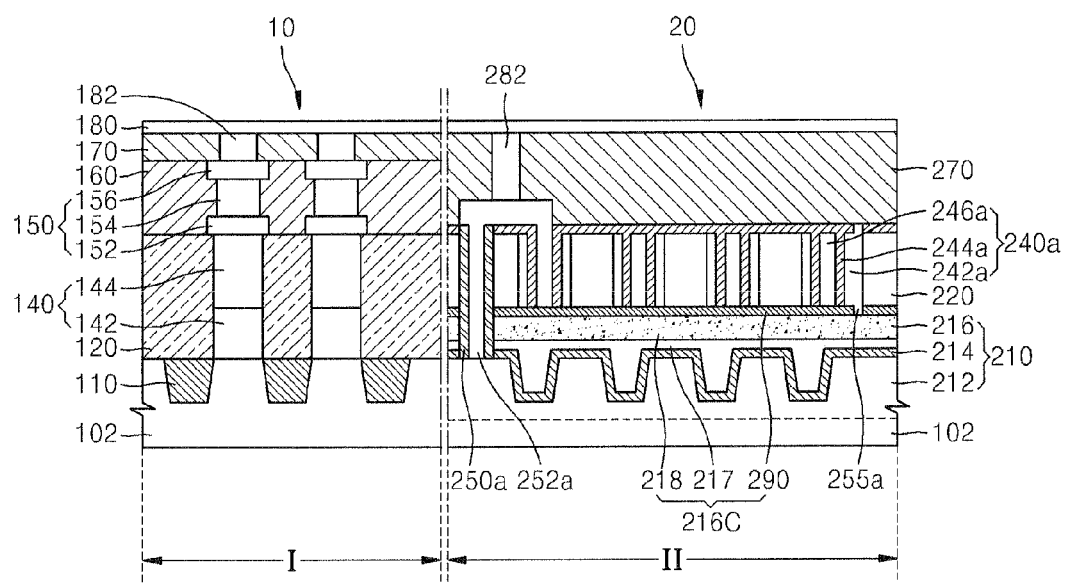

Referring to FIG. 32, the storage structure 150 including a phase-change material is formed on the diode 140, the bit line 180 is formed in the first region I, and the wire line 280 is formed in the second region II, thereby completing the phase-change memory device 600.

Figure 33:
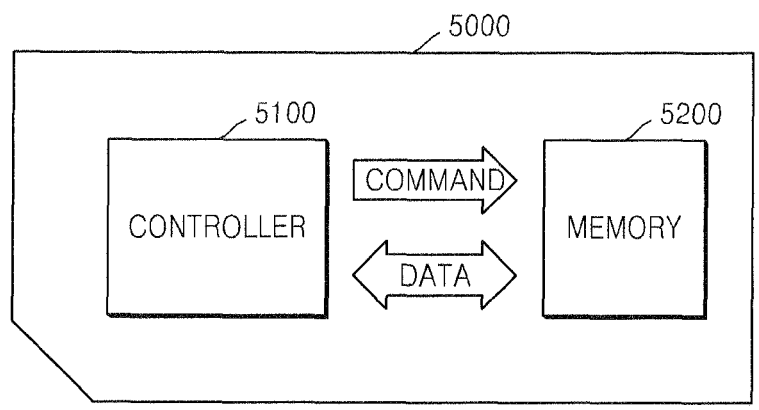
FIG. 33 is a schematic diagram of illustrating an embodiment of a memory card according to some embodiments of the inventive concept.

FIG. 33 is a schematic view of illustrating an embodiment of a memory card 5000 according to some embodiments of the inventive concept.

Referring to FIG. 33, a controller 5100 and a memory 5200 are disposed to send/receive electric signals to/from each other. For example, when the controller 5100 gives a command to the memory 5200, the memory 5200 can send data. The memory 5200 can include the phase change memory devices according to an embodiment of the inventive concept. The phase change memory devices according to the various embodiments of the inventive concept can be disposed in NAND or NOR architecture arrays in correspondence to the logic gate design. Such NAND and NOR arrays are generally known in the art. The memory arrays disposed in a plurality of rows and columns can have one or more memory array bank (not shown). The memory 5200 can include the memory array (not shown) or the memory array bank (not shown), all of which are known in the art. The memory card 5000 can further include conventional members, such as a conventional row decoder (not shown), a column decoder (not shown), input/output (I/O) buffers (now shown), and/or a control resistor (not shown) in order to drive the memory array bank (not shown), all of which are known in the art. The memory card 5000 can be used in memory devices as a memory card, for example, such as a memory stick card, a smart media (SM) card, a secure digital (SD) card, a mini SD card, or a multi media card (MMC).

Figure 34:
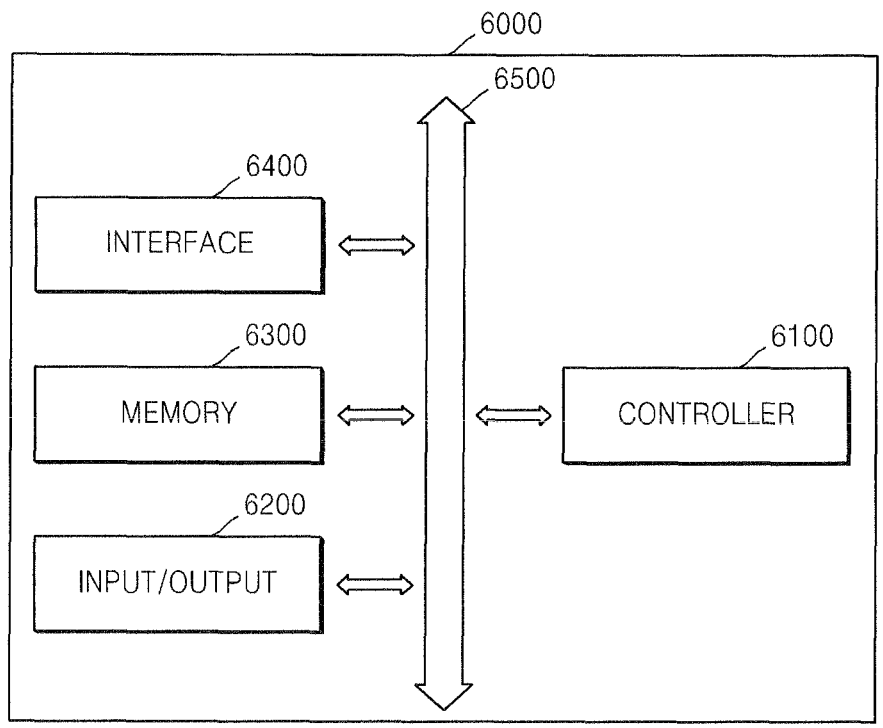
FIG. 34 is a schematic diagram of a system according to some embodiments of the inventive concept.

FIG. 34 is a schematic diagram of a system 6000 including a phase change memory device according to an embodiment of the inventive concept.

Referring to FIG. 34, the system 6000 may include a controller 6100, an input/output device 6200, a memory 6300, and an interface 6400. The system 6000 may be a mobile system or a system that transmits or receives data. The mobile system may be a personal digital assistant (PDA), a portable computer, a web tablet, a wireless phone, a mobile phone, a digital music player, or a memory card. The controller 6100 executes a software program and controls the system 6000. The controller 6100 may be a microprocessor, a digital signal processor, a microcontroller, or the like. The input/output device 6300 can be used to input or output data of the system 6000. The system 6000 is connected to an external apparatus, for example, a personal computer or a network, using the input/output device 6200, to send/receive data to/from the external apparatus. The input/output device 6200 may be a keypad, a keyboard, or a display. The memory 6300 may store codes and/or data for operating the controller 6100 and/or may store data processed by the controller 6100. The memory 6300 may include a phase change memory device according to an embodiment of the inventive concept. The interface 6400 may be a data transmission path between the system 6000 and an external apparatus. The controller 6100, the input/output device 6200, the memory 6300, and the interface 6400 may communicate with one another by a bus 6500. For example, the system 6000 can be used for a mobile phone, a MP3 player, a navigation system, a portable multimedia player (PMP), a solid state disk (SSD), or a household appliance.

FIG. 34 is a perspective view of an electronic device 7000 in which a semiconductor device manufactured according to some embodiments of the inventive concept can be used.

Figure 35:
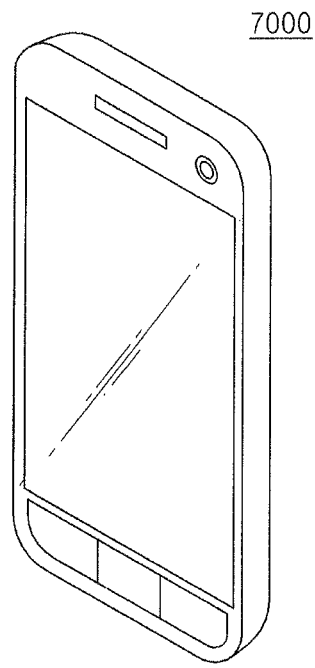
FIG. 35 is a perspective view of an electronic device having a semiconductor device manufactured according to some embodiments of the inventive concept.

Referring to FIG. 35, the electronic system (6000, see FIG. 33) is used for the mobile phone 7000. Besides, the electronic system (6000, see FIG. 33) may be used for a portable laptop computer, a MP3 player, a navigation system, a solid state disc (SSD), a car, or a household appliance.

The foregoing is illustrative of exemplary embodiments and is not to be construed as limiting thereof. Although exemplary embodiments have been described, those of ordinary skill in the art will readily appreciate that many modifications are possible in the exemplary embodiments without materially departing from the novel teachings and advantages of the exemplary embodiments. Accordingly, all such modifications are intended to be included within the scope of the claims. Exemplary embodiments are defined by the following claims, with equivalents of the claims to be included therein.

What is claimed is:

1. A vertically-stacked capacitor structure comprising:
a first capacitor including a first upper conductive layer, a first lower conductive layer and a first dielectric layer disposed between the first lower conductive layer and a lower surface of the first upper conductive layer; and
a second capacitor including a plurality of unit capacitors formed on an upper surface of the first upper conductive layer and defined by two neighboring insulation capacitor layers formed on the upper surface of the first upper conductive layer, each of the plurality of unit capacitors including a second lower conductive layer formed on both the upper surface of the first upper conductive layer and inner sidewalls of the two neighboring insulation capacitor layers, a second upper conductive layer and a second dielectric layer disposed between the second lower conductive layer and the second upper conductive layer; and
a contact plug connecting the second upper conductive layer and the first lower conductive layer.

2. The vertically-stacked capacitor structure of claim 1, wherein the second dielectric layer is further disposed on top of the two neighboring insulation capacitor layers.

3. The vertically-stacked capacitor structure of claim 1, wherein the second lower conductive layer is configured to have two parallel plates, each of two parallel plates being formed on the inner sidewalls of the two neighboring insulation capacitor layers respectively.

4. The vertically-stacked capacitor structure of claim 1, wherein the second lower conductive layer is configured to have a circular-shaped plate.

5. The vertically-stacked capacitor structure of claim 1, wherein the second dielectric layer is configured to have an U-shaped plate.

6. The vertically-stacked capacitor structure of claim 1, wherein the first upper conductive layer is a single conductive layer.

7. The vertically-stacked capacitor structure of claim 6, wherein the single conductive layer is a polysilicon layer doped with one of first and second conductivity type impurities.

8. The vertically-stacked capacitor structure of claim 1, wherein the first upper conductive layer includes at least two conductive layers stacked on each other, one of the conductive layers being a metal layer.

9. The vertically-stacked capacitor structure of claim 8, wherein the first upper conductive layer further includes an insulation layer on top of the conductive layers, the insulation layer including one or more contact plugs to connect the second upper conductive layer and the metal layer.

10. The vertically-stacked capacitor structure of claim 1, wherein the first lower conductive layer includes recessed non-planar regions, an upper portion of the first lower conductive layer being doped with one of first and second conductivity type impurities.

11. A phase change memory device comprising:
a phase change memory structure including a storage structure and a diode; and
a vertically-stacked capacitor structure electrically connected in parallel to each other, the vertically-stacked capacitor structure comprising:
a first capacitor including a first upper conductive layer, a first lower conductive layer and a first dielectric layer disposed between the first lower conductive layer and a lower surface of the first upper conductive layer; and
a second capacitor including a plurality of unit capacitors formed on an upper surface of the first upper conductive layer and defined by two neighboring insulation capacitor layers formed on the upper surface of the first upper conductive layer, each of the plurality of unit capacitors including a second lower conductive layer formed on both the upper surface of the first upper conductive layer and inner sidewalls of the two neighboring insulation capacitor layers, a second upper conductive layer and a second dielectric layer disposed between the second lower conductive layer and the second upper conductive layer; and
a contact plug connecting the second upper conductive layer and the first lower conductive layer.

12. The phase change memory device of claim 11, wherein the second lower conductive layer is configured to have two parallel plates, each of two parallel plates being formed on the inner sidewalls of the two neighboring insulation capacitor layers respectively.

13. The phase change memory device of claim 11, wherein the second lower conductive layer is configured to have a circular-shaped plate.

14. The phase change memory device of claim 11, wherein the second dielectric layer is configured to have an U-shaped plate.

* * * * *